(12) United States Patent
Kiil et al.

(10) Patent No.: US 9,972,767 B2
(45) Date of Patent: May 15, 2018

(54) ALL COMPLIANT ELECTRODE

(71) Applicant: Danfoss A/S, Nordborg (DK)

(72) Inventors: Hans-Erik Kiil, Soenderborg (DK); Mohamed Benslimane, Nordborg (DK)

(73) Assignee: Danfoss A/S, Nordborg (DK)

( * ) Notice: Subject to any disclaimer, the term of this patent is extended or adjusted under 35 U.S.C. 154(b) by 372 days.

(21) Appl. No.: 14/765,955

(22) PCT Filed: Feb. 4, 2014

(86) PCT No.: PCT/DK2014/050026
§ 371 (c)(1),
(2) Date: Aug. 5, 2015

(87) PCT Pub. No.: WO2014/121799
PCT Pub. Date: Aug. 14, 2014

(65) Prior Publication Data
US 2015/0372220 A1 Dec. 24, 2015

(30) Foreign Application Priority Data
Feb. 7, 2013 (DK) .................................. 2013 00074

(51) Int. Cl.
*H01L 41/08* (2006.01)
*H01L 41/047* (2006.01)
(Continued)

(52) U.S. Cl.
CPC ........ *H01L 41/0825* (2013.01); *H01L 41/047* (2013.01); *H01L 41/0986* (2013.01); *H01L 41/193* (2013.01)

(58) Field of Classification Search
CPC .................. H01L 41/0825; H01L 41/047; H01L 41/0986
See application file for complete search history.

(56) References Cited

U.S. PATENT DOCUMENTS 3,629,625 A * 12/1971 Schafft .................. H04R 17/00
310/332
4,241,325 A * 12/1980 Di Giovanni ......... G01L 9/0055
338/4
(Continued)

FOREIGN PATENT DOCUMENTS

CN      101459390 A    6/2009
WO       01/06579 A2   1/2001
(Continued)

OTHER PUBLICATIONS

International Search Report for PCT Serial No. PCT/DK2014/050026 dated Apr. 8, 2014.
(Continued)

*Primary Examiner* — Robert W Horn
(74) *Attorney, Agent, or Firm* — McCormick, Paulding & Huber LLP

(57) ABSTRACT

The invention relates to a dielectric transducer structure comprising a body of elastomeric material that is provided with an electrode arrangement on each of two boundary surfaces lying oppositely to one another. At least one boundary surface comprises a corrugated area that comprises heights and depths. The aim of the invention is to improve the compliance to elastic deformations of the dielectric transducer structure. To this end, the heights and depths are arranged in both perpendicular directions of the boundary surface.

19 Claims, 4 Drawing Sheets

(51) Int. Cl.
*H01L 41/09* (2006.01)
*H01L 41/193* (2006.01)

(56) References Cited

U.S. PATENT DOCUMENTS

| | | | | |
|---|---|---|---|---|
| 4,467,656 A | * | 8/1984 | Mallon | G01L 9/0042 338/4 |
| 5,177,579 A | * | 1/1993 | Jerman | G01L 9/0042 200/83 N |
| 5,350,966 A | * | 9/1994 | Culp | B63H 19/00 310/328 |
| 5,755,909 A | * | 5/1998 | Gailus | B41J 2/14201 156/221 |
| 6,376,971 B1 | * | 4/2002 | Pelrine | F04B 35/00 310/363 |
| 6,940,211 B2 | * | 9/2005 | Pelrine | F04B 35/00 310/330 |
| 7,368,862 B2 | * | 5/2008 | Pelrine | F02G 1/043 310/365 |
| 7,518,284 B2 | * | 4/2009 | Benslimane | B81B 3/007 310/311 |
| 7,548,015 B2 | * | 6/2009 | Benslimane | B81B 3/007 310/363 |
| 7,732,999 B2 | * | 6/2010 | Clausen | H01L 41/083 310/328 |
| 7,880,371 B2 | * | 2/2011 | Benslimane | H01L 41/083 310/367 |
| 8,058,779 B2 | * | 11/2011 | Suenaga | H01L 41/047 310/358 |
| 8,181,338 B2 | * | 5/2012 | Benslimane | B81B 3/0021 29/825 |
| 8,421,304 B2 | * | 4/2013 | Hino | H01L 41/047 310/300 |
| 8,421,316 B2 | * | 4/2013 | Tryson | H01L 41/047 310/363 |
| 8,891,222 B2 | * | 11/2014 | Benslimane | H01G 5/16 361/273 |
| 8,981,621 B2 | * | 3/2015 | Pelrine | H01L 41/45 310/328 |
| 9,142,750 B2 | * | 9/2015 | Ohnishi | H01L 41/047 |
| 9,231,186 B2 | * | 1/2016 | Busgen | F15D 1/12 |
| 2004/0012301 A1 | | 1/2004 | Benslimane et al. | |
| 2007/0116858 A1 | | 5/2007 | Benslimane et al. | |
| 2012/0248942 A1 | * | 10/2012 | Biggs | H01L 41/047 310/363 |
| 2014/0333992 A1 | * | 11/2014 | Wagemans | H01L 41/0986 359/315 |
| 2015/0372220 A1 | * | 12/2015 | Kiil | H01L 41/047 310/309 |

FOREIGN PATENT DOCUMENTS

| | | |
|---|---|---|
| WO | 03/056287 A1 | 7/2003 |
| WO | 03056287 A1 | 7/2003 |
| WO | 2006128709 A2 | 12/2006 |
| WO | 2012/122440 A2 | 9/2012 |
| WO | 2012122440 A2 | 9/2012 |
| WO | 2013049485 A1 | 4/2013 |

OTHER PUBLICATIONS

Kovacs G et al. "Stacked dielectric elastomer actuator for tensile force transmission" Sensors and Actuators A, vol. 155, No. 2, Oct. 1, 2009 (Oct. 1, 2009), pp. 299-307, XP026708397, ISSN: 0924-4247, DOI: 10.1016/J.SNA.2009.08.027.

Benslimane M et al.: "Mechanical properties of dielectric elastomer actuators with smart metallic compliant electrodes", Proceedings of SPIE, vol. 4695, Jan. 1, 2002 (Jan. 1, 2002), pp. 150-157, XP002445816, ISSN: 0277-786X, DOI:10.1117/12.475160 2. Actuator/Sensor Processing.

Article entitled "Mechanical Properties of Dielectric Elastomer Actuators with Smart Metallic Compliant Electrodes." by Mohamed Benslimane Smart Structures and Materials 2002 Roskilde, Denmark. pp. 150-157.

Article entitled "Stacked Dielectric Elastomer Actuator for Tensile Force Transmission" by Kovacs et al. Sensors and Actuators 2009. Switzerland. pp. 299-307.

* cited by examiner

ALL COMPLIANT ELECTRODE

CROSS-REFERENCE TO RELATED APPLICATION

This application is entitled to the benefit of and incorporates by reference subject matter disclosed in the International Patent Application No. PCT/DK2014/050026 filed on Feb. 4, 2014 and Danish Patent Application PA 2013 00074 filed Feb. 7, 2013.

TECHNICAL FIELD

The invention relates to a dielectric transducer structure comprising a body of elastomeric material, wherein the body on each of two boundary surfaces lying oppositely to one another is provided with an electrode arrangement, wherein at least one boundary surface comprises at least one corrugated area, and wherein the at least one corrugated area comprises heights and depths.

BACKGROUND

A transducer may here in particular be an actuator, a sensor or a generator, but the invention may also refer to other types of transducers.

Such a dielectric transducer structure is known from US 2004/0012301 A1. Dielectric transducers work by using the attraction between two electrodes located on an elastomeric body that leads to a compression of the body in one direction and a corresponding extension of the body in a second direction. If such structures are used as actuators, the electrostatic force between the two electrodes is used to compress the body. Alternatively, such structures may be used as sensors by operating the electrodes as the plates of a capacitor. In this mode an external force compresses the body in one direction and reduces the distance between the electrodes. Thus the capacity of the electrode capacitor is increased allowing to measure the applied force. According to US 2004/0012301 A1 at least one of the boundary surfaces has a waved area with heights and depths as extreme values running parallel to a transverse direction of the body. With this solution the transducer structure can be easily extended in one direction of the boundary surface. On the other hand, the transducer structure will display a very small compliance to elastic deformations in the direction transversal to the direction of corrugation.

WO 03/056287 A1 shows another dielectric transducer structure. In this case two elastic bodies with one flat and one corrugated surface each are laminated together with their flat surfaces facing each other. This way the negative effects of impurities or damages in the elastomeric bodies are minimized.

Corrugations of the kind as illustrated in US 2004/0012301 and WO 03/056287 is very suitable for anisotropic purposes where a change in the electrostatic force between the two electrodes by compression prolongs the body in essentially one planar direction given by the parallel extension of the corrugations.

Furthermore, the known dielectric transducer structures sometimes suffer from broken electrodes because part of the mechanical forces will always work in the non-compliant direction of the structure. In the non-compliant direction, the electrodes are flat and thus the elasticity of the structure is mainly limited by the typically high elastic modulus of electrode materials, for example metals. If the strains in this direction become too large, the electrode will thus break.

New applications of dielectric transducer structures now ask for a compliance to elastic deformations in both planar directions of the boundary surfaces, or more preferable in all planar directions in the two plane level.

One document WO 01/06579 discloses an electroactive polymer including a roughened surface having random texturing, where this roughened surface allows for planar deflection that is not directionally compliant. Such a random texturing however also implies loss in the control of the transducer performance.

The solution is to introduce an 'egg tray' kind of surface structure, it has however been found that not any such structure will have sufficient compliance in all planar directions, the risk is especially for non-randomized but more regular surface structures, where there is a risk that 'straight lines' may appear at the surface topology. Such straight lines are sections where the surface topology is basically flat and extend along some line or sections of a direction in the plane, along such lines the compliance is low and there is risk of electrode damage when the polymer is stretched.

SUMMARY

The task of the invention thus is to provide a dielectric transducer structure that is compliant to elastic deformations in all directions and also displays a reduced risk of electrode damage.

The object of the invention is solved in that the heights and depths are arranged along both perpendicular directions of the boundary surface.

With this solution, the dielectric transducer structure will be compliant to deformations in both perpendicular planar directions of the boundary surface. Since at least one corrugated area comprises heights and depths in at least two perpendicular directions of the boundary surface, the structure can be deformed in all directions with a severely reduced risk of damage to the electrode. Furthermore, by choosing the particular shapes of the corrugations in the two planar directions, the compliance to deformation in these directions can be individually adjusted for each application.

It is preferred that the heights and depths are arranged periodically at least along one of the two perpendicular directions. This way it is ensured that the structure can be uniformly deformed along at least one of the two perpendicular directions.

It is preferred that the heights and depths are periodic along both of the perpendicular directions, with corrugation periods and corrugation peak to peak amplitudes. Accordingly, one may choose the corrugation periods as well as the corrugation peak to peak amplitudes in such a way that the compliance to elastic deformations in each of the two perpendicular directions can be adjusted to the application.

In another preferred embodiment the sum of the corrugation peak to peak amplitudes of both perpendicular directions is less than or equal to one quarter of the mean thickness of the body between the two boundary surfaces. This way, it is ensured that the electric field distortions in the elastomeric body between the two electrode arrangements stay small. Furthermore, a high degree of homogeneity of the electric field throughout the elastomeric body can be achieved.

In another preferred embodiment the corrugation period is substantially equal to the corresponding corrugation peak to peak amplitude in at least one of the two perpendicular directions. By choosing the corrugation period to be substantially equal to the corresponding corrugation peak to peak amplitude, one may achieve a high level of compliance to elastic deformations of the dielectric transducer structure in the corresponding direction. By the term substantially equal it is not meant that the two quantities have to be equal in the mathematical sense.

To solve the object of avoiding straight lines the present invention introduces that the corrugation peak to peak amplitudes are different in the two perpendicular directions. This way one may avoid that substantially straight lines appear in the boundary surface and/or the electrode arrangement. Along such substantially straight lines the height of the corrugation profile stays almost or completely the same. In other words the boundary surface and the electrode arrangement are flat along these lines. Such lines of substantially equal height will for example occur if the corrugation in the two perpendicular directions displays a high degree of symmetry. By choosing the corrugation peak to peak amplitudes to be different, this symmetry is broken and extended lines of substantially equal height in the at least one corrugated area will no longer occur. Such lines of equal height could otherwise lead to damages to the electrode arrangement because the electrode arrangement would not be able to stretch along these lines when applied with a force.

Preferably, the corrugation peak to peak amplitude of one of the perpendicular directions is larger by at least 50% compared to the corrugation peak to peak amplitude of the other perpendicular direction. This way one may ensure that lines of substantially equal height in the boundary surface and the electrode arrangement are avoided. Furthermore, it is ensured that the local compliance to elastic deformations does not vary to much in different parts of the at least one corrugated area of the boundary surface and/or the electrode arrangement.

In another preferred embodiment the heights and depths have a sinusoidal-like shape along at least one of the two perpendicular directions. Using a sinusoidal-like shape for the corrugation along at least one of the directions will ensure that the local compliance to elastic deformations will not vary too strongly. For example, if one uses a rectangular profile for the corrugation, the local compliance can vary strongly, i.e. the compliance will be very low along the heights and depths and will be very high at the flanks between the heights and depths. Thus, in case of a rectangular corrugation profile, the danger of damage to the electrode arrangements will be higher than in case of a sinusoidal-like shape of the corrugation profile.

Preferably, the electrode arrangement covers the at least one corrugated area completely. If the at least one corrugated area covers the whole boundary surface, the electrode arrangement will also cover the same area. Thus, the electric charge can be transferred to substantially every point of the boundary surface of the body such that the built up of the electric field between the two electrode arrangement will occur uniformly.

In another preferred embodiment, there are no lines of substantially equal height in the at least one corrugated area. As explained earlier, in case of a sinusoidal shape of the corrugation, this may be achieved by choosing the corrugation peak to peak amplitudes to be different in the two perpendicular directions of the boundary surface. If the heights and depths do not occur periodically in one or both of the perpendicular directions of the boundary surface, the shape of the corrugations in the two different perpendicular directions has to be chosen correspondingly to avoid such lines of substantially equal height in the at least one corrugated area. This way one will thus reduce the likelihood of damage to the electrode arrangements substantially.

In another preferred embodiment the electrode arrangement has a substantially constant thickness. Thus, the compliance to elastic deformations will not vary within the structure due to changes in the thickness of the electrode arrangement but mostly due to the chosen shape of the corrugation. Consequently, it is easier to choose and control the compliance of the electrode arrangement in both perpendicular directions.

It is furthermore preferred that the ratio of corrugation peak to peak amplitude to the thickness of the electrode arrangement lies in the range of 30 to 60. Experience has shown that such a ratio will allow for a high level of compliance of the dielectric transducer structure while still maintaining a sufficiently high stability of the electrode arrangement.

BRIEF DESCRIPTION OF THE DRAWINGS

Preferred embodiments of the invention will now be described with reference to the accompanying drawings.

DETAILED DESCRIPTION

Figure 1:
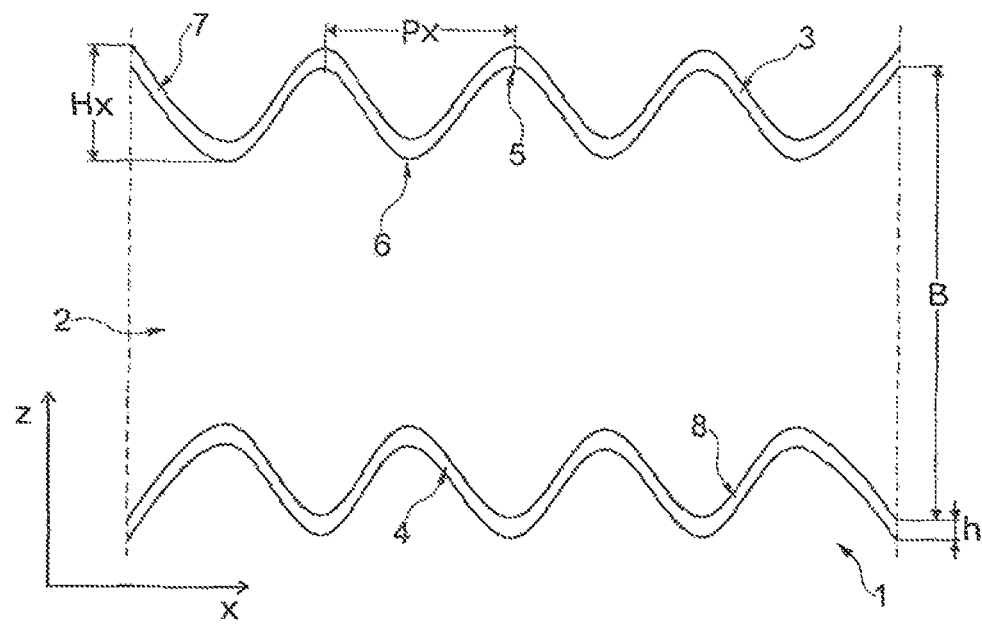
FIG. 1 shows a dielectric transducer structure according to the invention in a cut view.
Figure 2:
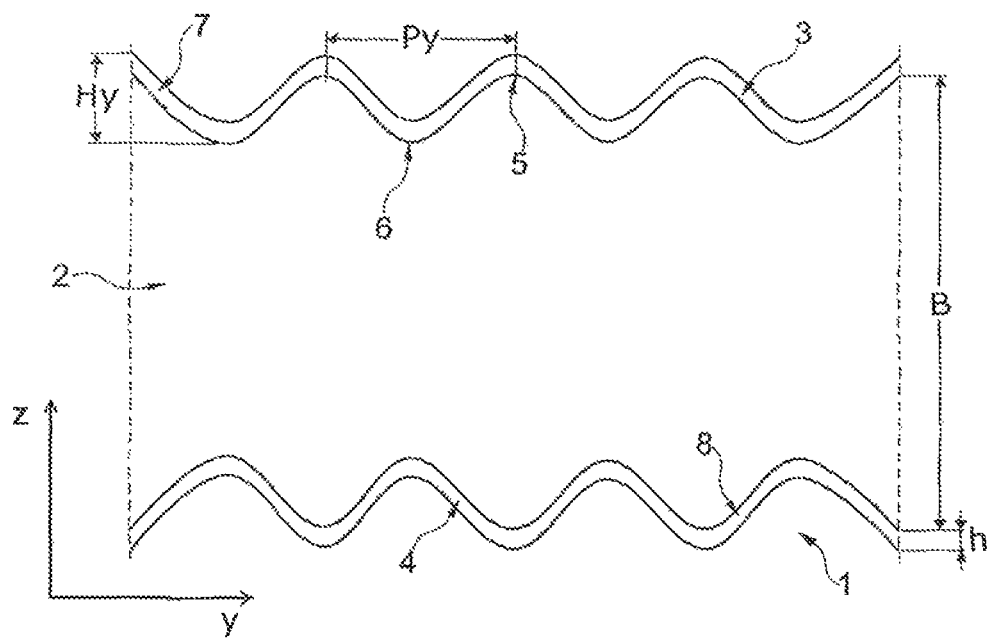
FIG. 2 shows the same dielectric transducer structure according to FIG. 1 in a cut view perpendicular to the view of FIG. 1.

FIG. 1 and FIG. 2 show a dielectric transducer structure 1, comprising a body of elastomeric material 2. The body 2 has two boundary surfaces 3, 4 lying oppositely to one another. The boundary surfaces 3, 4 are corrugated along a first direction X as well as along a second direction Y, wherein the first direction X is perpendicular to the second direction Y. The two perpendicular directions X, Y would be parallel to corresponding flat, uncorrugated boundary surfaces. Along each of the directions X, Y the corrugation includes heights 5 as well as depths 6. A third direction Z is perpendicular to both directions X and Y.

Each of the boundary surfaces 3, 4 is provided with an electrode arrangement 7, 8. In the given embodiment the electrode arrangement 7, 8 has a substantially constant thickness h. The electrode arrangements 7, 8 may be deposited on the boundary surfaces 3, 4 using vapor deposition or electrolytic techniques, and may contain or consist of a metal such as copper or silver.

In FIG. 2 the same dielectric transducer structure is shown as in FIG. 1. In this case, a different direction for the cut view has been chosen. The dielectric transducer structure shows two different profiles of corrugation along the two directions X and Y. The corrugation profile in this case is of a sinusoidal-like shape in both of the directions X, Y. Consequently, the heights 5 and depths 6 of the corrugation profiles are periodic with a period $P_x$ in the direction X and with a period $P_y$ in the direction Y. Furthermore, in this case, there will also be characteristic peak to peak amplitudes $H_x$ and $H_y$ in both directions X and Y.

Figure 3:
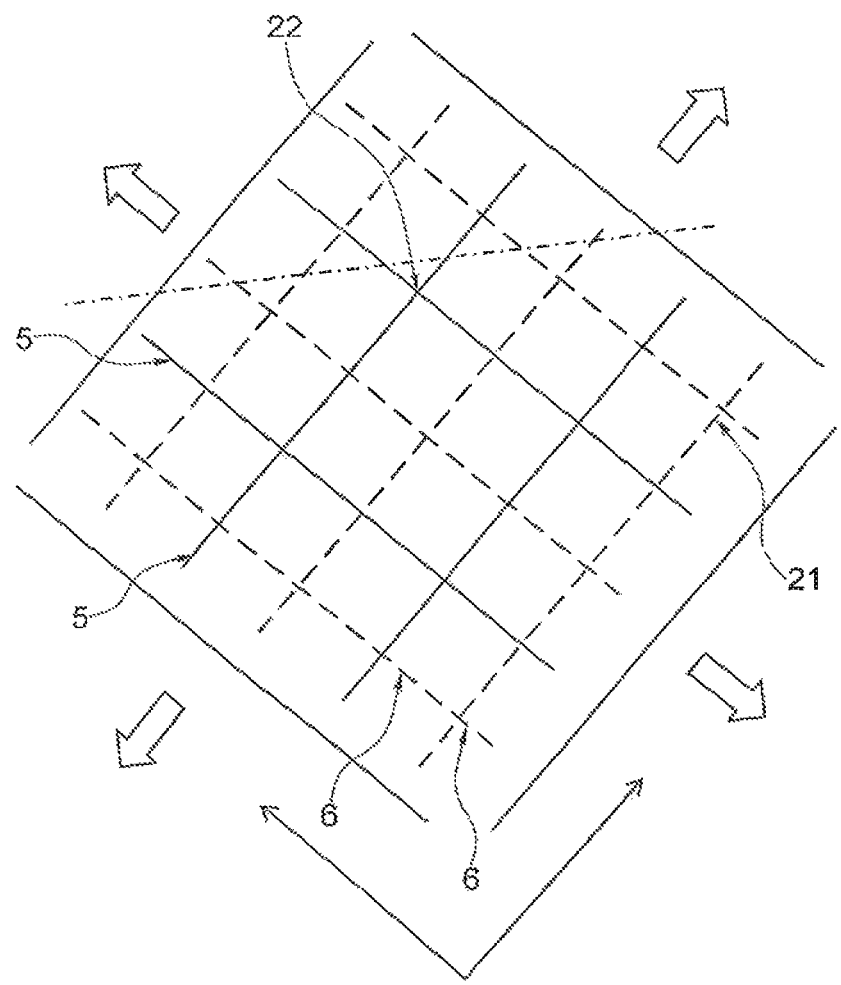
FIG. 3 shows a top 2D view of the boundary surfaces of the dielectric transducer structure.

In the given embodiment according to FIGS. 1, 2 and 3 the corrugation peak to peak amplitudes $H_x$, $H_y$ in the two directions X, Y are chosen to be different. In particular, $H_x$ is in this case 50% larger than $H_y$. This way it is ensured that there are no extended lines of substantially equal height in Z-direction in the boundary surface, the straight lines of surface topology.

Mathematically one embodiment profile of a surface topology according to the present invention can be expressed by the following function:

$$z=f(x,y)=\tfrac{1}{2}H_x*\mathrm{Sin}(2*pi*x/P_x)+\tfrac{1}{2}H_y*\mathrm{Sin}(2*pi*y/P_y),$$   a.

where Sinus naturally could be replaced by 'Cosinus' or any other periodic expression.

'x' is the coordinate in length direction, 'y' is the coordinate in width direction, 'z' is the coordinate in thickness direction, 'Hx' is corrugation depth in x-direction, 'Px' is corrugation period in x-direction, 'Hy' is corrugation depth in y-direction and 'Py' is corrugation period in y-direction.

In FIG. 3 a top view illustrating in 2D the surface topology having a corrugated profile formed extending in the X-direction having heights 5 and crests 6 and formed with period Px and peak amplitudes $H_x$, and correspondingly a corrugated profile formed extending in the Y-direction having heights 5 and crests 6 and formed with period Py and peak amplitudes $H_y$.

The actual height at any X,Y position will be the sum of the actual heights at that position of the formed corrugation profiles extending in the X and Y directions. In the illustration the two periods are the same, $P_x=P_y$, and they are aligned such that with the same period a height 5 of the X-direction corrugation matches with a height 5 of the Y-direction corrugation, e.g. at a spot 20, and correspondingly a crest 6 matches a crest 6, e.g. at a spot 21. At the tops such as 20 no material will have been removed, or at least the minimum thickness of material has been removed, and at minimums such as 21 a maximum thickness of material has been removed.

If the two peak amplitudes are equal, Hx=Hy, then at the line (22) running through the points (23a, 23b) where one of the corrugations is at a peak and the other at a low then only material of one of the X or Y-direction corrugations is removed, the fraction of the one increasing and the fraction of the other more or less correspondingly decreasing following the line (22) to the next peak. This gives a line being substantially straight, at least seen in the plane, the line being substantially flat seen in the Z-direction (being the direction perpendicular to both the X and the Y directions of the plane). It may zig-zag slightly but this being too insignificant to give sufficient compliance (perhaps only 1-5 percent) for many purposes.

If however the two peak amplitudes are different, Hx being different from Hy, then a corrugation of the line (22) would be formed in the Z-direction too.

Figure 4A:
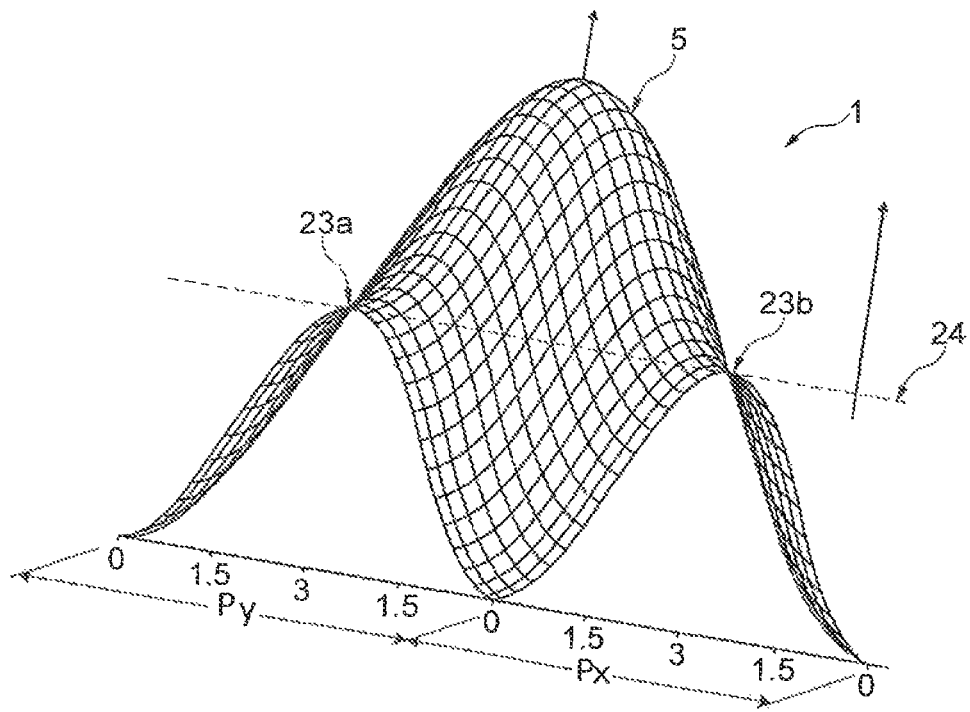
FIGS. 4A&B show isometric views of one of the boundary surfaces of the dielectric transducer structure for two different peak heights.
Figure 4B:
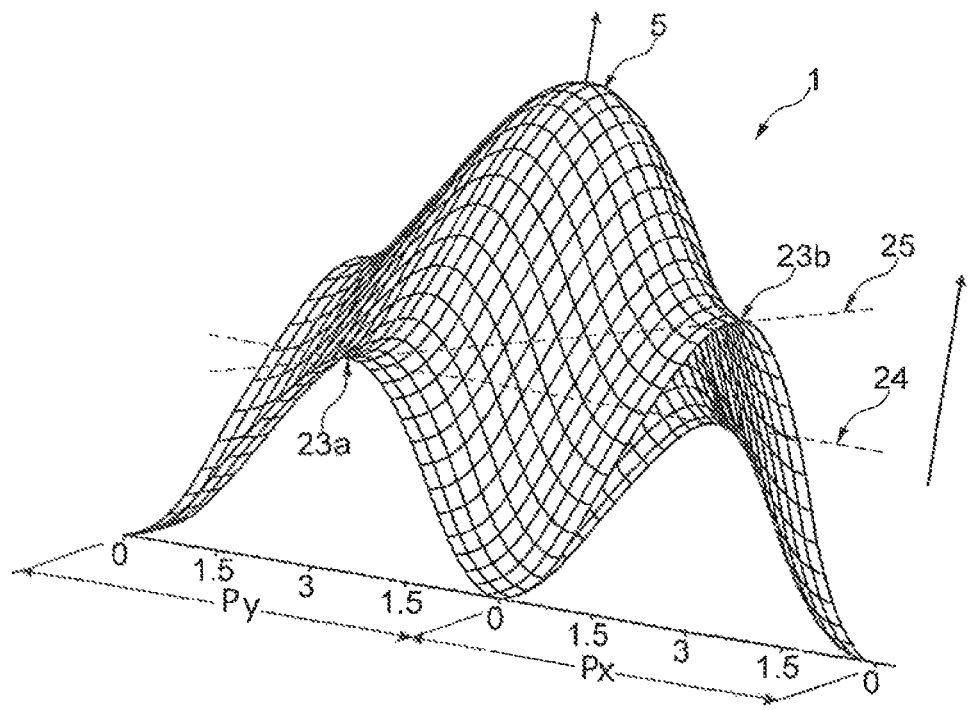

FIGS. 4A and 4B illustrate this situation where an isometric view of one of the boundary surfaces 3, 4 is shown looking into the X-Y plane. FIG. 4A show the situation where the peak amplitudes are equal, Hx=Hy, thus giving line (24) parallel to the X and Y plane extending from the position (23a) where the first of the corrugations is at a peak and the other at a low, to the next position (23b) where the situation is vice versa.

FIG. 4B however show a situation where the two peak amplitudes are different, Hx being different from Hy, here the line (25) has a slow from position (23a) to (23b) where after it would drop again, thus giving a corrugation in the Z direction.

Figure 5:
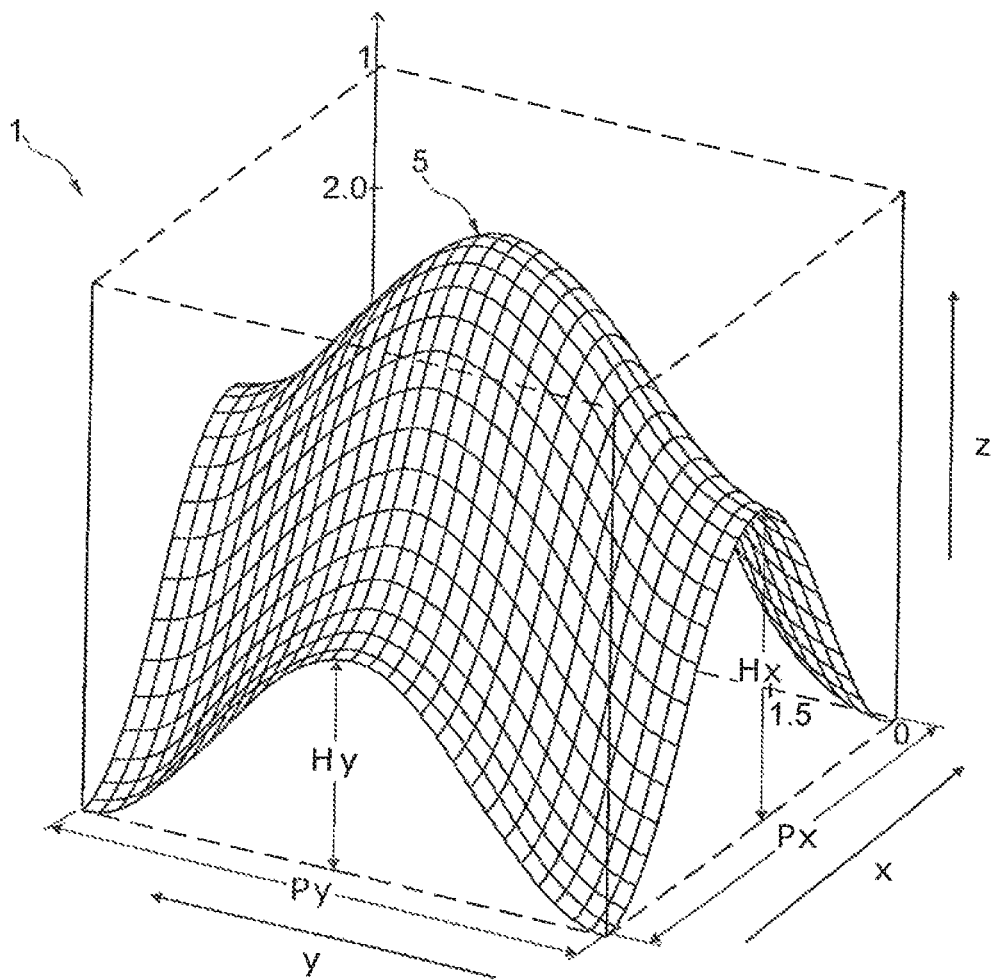
FIG. 5 shows an isometric top view of one of the boundary surfaces of the dielectric transducer structure.

In FIG. 5 an isometric top view of one of the boundary surfaces 3, 4 is shown. According to FIG. 3, the dielectric transducer structure 1 again is provided with a two-dimensional sinusoidal profile of corrugation in the boundary surfaces 3, 4. The height distance in Z-direction between the highest heights 5 and the deepest depths 6 of the boundary surface is in this case given by the sum $H_x+H_y$ of the two one-dimensional peak to peak amplitudes. To ensure a high level of homogeneity of the electric field between the two electrode arrangements 7, 8, the sum $H_x+H_y$ of the two one-dimensional peak to peak amplitudes should be less than or equal to one quarter of the mean thickness B of the body 2 between the boundary surfaces 3, 4.

FIG. 5 also clarifies what is meant by a line of substantially equal height in one of the boundary surfaces 3, 4. If for example for a given two-dimensional sinusoidal profile of corrugation the peak to peak amplitudes $H_x$, $H_y$ in both perpendicular directions X, Y are chosen to be the same, there will be periodic lines of equal height appearing in the boundary surface. Along these periodic lines the height in Z-direction will not change. Consequently, an electrode arrangement on the boundary surface will be more likely to break at such lines since the compliance to elastic deformation is much lower than in the rest of the corrugated area.

For a two-dimensional sinusoidal profile of corrugation such lines of substantially equal height can be avoided by choosing different values for the two peak to peak amplitudes $H_x$, $H_y$ in X- and Y-direction. Choosing the corrugation periods $P_x$, $P_y$ to be different will not eliminate such lines for a sinusoidal profile.

In contrast to that in the state of the art, the dielectric transducer structures are only compliant to elastic deformations in one of the two directions X, Y of the boundary surface. Thus, the dielectric transducer structure according to the invention allows for a broader scope of applications. At the same time, a risk of damage to the electrodes is reduced by achieving a much more homogeneous level of compliance to deformations in both directions of the boundary surface.

The compliance to deformations can furthermore be expressed using a compliance factor $F_c$, that can be different in both directions X, Y of the boundary surface 3, 4. The compliance factor $F_c$ can be related to an effective elastic modulus $Y_{\mathit{eff}}$ of the dielectric transducer structure via $Y_{\mathit{eff}}=Y_{\mathit{flat}}/F_c$. In this case $Y_{\mathit{flat}}$ is the elastic modulus of a corresponding flat electrode arrangement of the same material and mean thickness. The compliance factor $F_c$ in one direction can then be estimated for small deformations from the bending beam theory to be $F_c \approx s/P\,(H/2h)^2$ for periodic corrugation profiles. In this case s is the corrugation contour length for one period of corrugation, P is period of corrugation, H is the corresponding peak to peak amplitude and h is the thickness of the electrode arrangement. The factor of proportionality depends on the shape of the corrugation profile. Thus, the compliance factor $F_c$ can be different in both directions X, Y of the boundary surfaces 3, 4 but can be adjusted by choosing the corrugation periods $P_x$, $P_y$ and the corrugation peak to peak amplitudes $H_x$, $H_y$ according to the application. In contrast to that in the state of the art, the effective elastic modulus in one of the directions of the boundary surface will be given by the elastic modulus of a flat transducer structure and will thus be much higher than the effective elastic modulus in the direction of the corrugation. Consequently, the resulting problems as present in the state of the art can be avoided with a dielectric transducer structure according to the invention.

The embodiments of the invention described above are provided by way of example only. The skilled person will be aware of many modifications, changes and substitutions that could be made without departing from the scope of the present invention. The claims of the present invention are intended to cover all such modifications, changes and substitutions as fall within the spirit and scope of the invention.

What is claimed is:

1. A dielectric transducer structure comprising a body of elastomeric material, wherein the body on each of two boundary surfaces lying oppositely to one another is provided with an electrode arrangement, wherein at least one boundary surface comprises at least one corrugated area, wherein the at least one corrugated area comprises heights and depths where the heights and depths are arranged along both perpendicular directions (X, Y) of the boundary surface wherein the corrugation peak to peak amplitudes ($H_x$, $H_y$) are different in the two perpendicular directions (X, Y) and wherein the electrode arrangement has a substantially constant thickness (h).

2. The dielectric transducer structure according to claim 1, wherein the heights and depths are arranged periodically at least along one of the two perpendicular directions (X, Y).

3. The dielectric transducer structure according to claim 2, wherein the heights and depths are periodic along both of the perpendicular directions (X, Y), with corrugation periods ($P_x$, $P_y$) and corrugation peak to peak amplitudes ($H_x$, $H_y$).

4. The dielectric transducer structure according to claim 1, wherein that the heights and depths have a sinusoidal-like shape along at least one of the perpendicular directions (X, Y).

5. The dielectric transducer structure according to claim 1, wherein the electrode arrangement covers the at least one corrugated area completely.

6. The dielectric transducer structure according to claim 1, wherein there are no lines of substantially equal height in the at least one corrugated area.

7. The dielectric transducer structure according to claim 1, wherein the ratio of corrugation peak to peak amplitude ($H_x$, $H_y$) to the thickness (h) of the electrode arrangement lies in the range of 30 to 60.

8. The dielectric transducer structure according to claim 2, wherein that the heights and depths have a sinusoidal-like shape along at least one of the perpendicular directions (X, Y).

9. The dielectric transducer structure according to claim 3, wherein that the heights and depths have a sinusoidal-like shape along at least one of the perpendicular directions (X, Y).

10. The dielectric transducer structure according to claim 2, wherein the electrode arrangement covers the at least one corrugated area completely.

11. The dielectric transducer structure according to claim 3, wherein the electrode arrangement covers the at least one corrugated area completely.

12. A dielectric transducer structure comprising a body of elastomeric material, wherein the body on each of two boundary surfaces lying oppositely to one another is provided with an electrode arrangement, wherein at least one boundary surface comprises at least one corrugated area, and wherein the at least one corrugated area comprises heights and depths where the heights and depths are arranged along both perpendicular directions (X, Y) of the boundary surface wherein the corrugation peak to peak amplitudes ($H_x$, $H_y$) are different in the two perpendicular directions (X, Y), wherein the heights and depths are periodic along both of the perpendicular directions (X, Y), with corrugation periods ($P_x$, $P_y$) and corrugation peak to peak amplitudes ($H_x$, $H_y$), and wherein the sum of the corrugation peak to peak amplitudes ($H_x$, $H_y$) of both perpendicular directions (X, Y) is less than or equal to one quarter of the mean thickness (B) of the body between the two boundary surfaces.

13. The dielectric transducer structure according to claim 12, wherein the corrugation period ($P_x$, $P_y$) is substantially equal to the corresponding corrugation peak to peak amplitude ($H_x$, $H_y$) in at least one of the two perpendicular directions (X, Y).

14. The dielectric transducer structure according to claim 12, wherein that the heights and depths have a sinusoidal-like shape along at least one of the perpendicular directions (X, Y).

15. The dielectric transducer structure according to claim 12, wherein the electrode arrangement covers the at least one corrugated area completely.

16. A dielectric transducer structure comprising a body of elastomeric material, wherein the body on each of two boundary surfaces lying oppositely to one another is provided with an electrode arrangement, wherein at least one boundary surface comprises at least one corrugated area, and wherein the at least one corrugated area comprises heights and depths where the heights and depths are arranged along both perpendicular directions (X, Y) of the boundary surface wherein the corrugation peak to peak amplitudes ($H_x$, $H_y$) are different in the two perpendicular directions (X, Y), wherein the heights and depths are periodic along both of the perpendicular directions (X, Y), with corrugation periods ($P_x$, $P_y$) and corrugation peak to peak amplitudes ($H_x$, $H_y$), and wherein the corrugation period ($P_x$, $P_y$) is substantially equal to the corresponding corrugation peak to peak amplitude ($H_x$, $H_y$) in at least one of the two perpendicular directions (X, Y).

17. The dielectric transducer structure according to claim 16, wherein the corrugation peak to peak amplitude ($H_x$) of one of the perpendicular directions (X) is at least 50% larger than the corresponding peak to peak amplitude ($H_y$) of the other perpendicular direction (Y).

18. The dielectric transducer structure according to claim 16, wherein that the heights and depths have a sinusoidal-like shape along at least one of the perpendicular directions (X, Y).

19. The dielectric transducer structure according to claim 17, wherein that the heights and depths have a sinusoidal-like shape along at least one of the perpendicular directions (X, Y).

* * * * *